United States Patent
Iwabuchi et al.

(10) Patent No.: US 10,453,885 B2
(45) Date of Patent: Oct. 22, 2019

(54) SOLID-STATE IMAGING APPARATUS AND ELECTRONIC DEVICE

(71) Applicant: SONY SEMICONDUCTOR SOLUTIONS CORPORATION, Kanagawa (JP)

(72) Inventors: Shin Iwabuchi, Kumamoto (JP); Kazuhiro Satou, Kumamoto (JP); Kensuke Motozono, Kumamoto (JP); Masatoshi Iwamoto, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/753,495

(22) PCT Filed: Aug. 26, 2016

(86) PCT No.: PCT/JP2016/074915
§ 371 (c)(1),
(2) Date: Feb. 19, 2018

(87) PCT Pub. No.: WO2017/043330
PCT Pub. Date: Mar. 16, 2017

(65) Prior Publication Data
US 2018/0247966 A1 Aug. 30, 2018

(30) Foreign Application Priority Data

Sep. 9, 2015 (JP) .................................. 2015-177293

(51) Int. Cl.
*H01L 27/146* (2006.01)
*H01L 29/786* (2006.01)
*H01L 27/14* (2006.01)

(52) U.S. Cl.
CPC ........ *H01L 27/14623* (2013.01); *H01L 27/14* (2013.01); *H01L 27/146* (2013.01); *H01L 27/14627* (2013.01); *H01L 29/78633* (2013.01)

(58) Field of Classification Search
CPC . H01L 27/14623; H01L 27/14; H01L 27/146; H01L 27/14627; H01L 29/78633
See application file for complete search history.

(56) References Cited

U.S. PATENT DOCUMENTS

2007/0132871 A1  6/2007 Masaaki et al.
2007/0252183 A1* 11/2007 Ishida ............... H01L 27/14812
                                                       257/292

(Continued)

FOREIGN PATENT DOCUMENTS

JP    2007-165650 A    6/2007
JP    2009-099626 A    5/2009

(Continued)

OTHER PUBLICATIONS

International Search Report and Written Opinion of PCT Application No. PCT/JP2016/074915, dated Oct. 25, 2016, 9 pages.

*Primary Examiner* — William Coleman
(74) *Attorney, Agent, or Firm* — Chip Law Group

(57) ABSTRACT

The present disclosure relates to a solid-state imaging apparatus and an electronic device capable of reducing a product yield and reliability risk. By forming a contact by forming an opening in an insulating film on a back surface of a peripheral circuit region without connecting a light-shielding metal on the peripheral circuit region to the ground (GND), the light-shielding metal is connected to a Si substrate. Furthermore, a light-shielding metal on a pixel region is connected to the ground (GND). Therefore, by disposing an isolated region (insulating region) where no metal is formed between the light-shielding metal on the pixel region (Continued)

and the light-shielding metal on the peripheral circuit region, the light-shielding metal on the pixel region does not cause a short circuit with the light-shielding metal on the peripheral circuit region. The present disclosure can be applied to, for example, a CMOS solid-state imaging apparatus used for an imaging apparatus such as a camera.

12 Claims, 9 Drawing Sheets

(56) References Cited

U.S. PATENT DOCUMENTS

| | | | |
|---|---|---|---|
| 2009/0108389 | A1 | 4/2009 | Inoue |
| 2012/0062777 | A1 | 3/2012 | Shoji et al. |
| 2012/0286137 | A1* | 11/2012 | Yamaguchi ....... H01L 27/14607 250/208.1 |
| 2014/0291793 | A1* | 10/2014 | Tanaka .............. H01L 27/14623 257/435 |
| 2015/0035100 | A1 | 2/2015 | Tanida |

FOREIGN PATENT DOCUMENTS

| | | |
|---|---|---|
| JP | 2012-064709 A | 3/2012 |
| JP | 2012-204390 A | 10/2012 |
| JP | 2014-007427 A | 1/2014 |
| JP | 2014-192348 A | 10/2014 |
| JP | 2015-032640 A | 2/2015 |

\* cited by examiner

SOLID-STATE IMAGING APPARATUS AND ELECTRONIC DEVICE

CROSS REFERENCE TO RELATED APPLICATIONS

This application is a U.S. National Phase of International Patent Application No. PCT/JP2016/074915 filed on Aug. 26, 2016, which claims priority benefit of Japanese Patent Application No. JP 2015-177293 filed in the Japan Patent Office on Sep. 9, 2015. Each of the above-referenced applications is hereby incorporated herein by reference in its entirety.

TECHNICAL FIELD

The present disclosure relates to a solid-state imaging apparatus and an electronic device, and particularly to a solid-state imaging apparatus and an electronic device capable of reducing a product yield and reliability risk.

BACKGROUND ART

In a back-surface irradiation-type solid-state imaging element, in a case of a chip having a layout in which a pixel region and a peripheral circuit are formed on the same Si substrate, a light-shielding material is usually formed on a back surface of the peripheral circuit so as to prevent an influence on device characteristics by charges generated by photoelectric conversion due to enter of light into a device formed in the peripheral circuit and containing Tr. For example, a metal having a high light-shielding property is formed on the peripheral circuit.

Patent Document 1 adopts a layout in which a light-shielding metal is formed on a peripheral circuit outside a pixel, and a slit is formed in a part of the metal in order to suppress film peeling due to a stress of the metal and generation of dust caused thereby. In addition, Patent Document 2 adopts a structure in which, in order to electrically stabilize a light-shielding metal formed on a back surface, a contact is opened on the back surface to connect a ground region in a Si substrate to the light-shielding metal, the light-shielding metal is thereby connected to the ground to prevent charges from being accumulated, and abnormal discharge and electrostatic breakdown during a process can be thereby prevented.

CITATION LIST

Patent Document

Patent Document 1: Japanese Patent Application Laid-Open No. 2012-294390
Patent Document 2: Japanese Patent Application Laid-Open No. 2014-7427

SUMMARY OF THE INVENTION

Problems to be Solved by the Invention

Meanwhile, in a processing step of a back side, there is a case where an insulating film does not have a film thickness or a shape of sufficient insulation resistance due to shape abnormality of a surface such as polishing digging or crystal defects generated at the time of thinning the back surface Si, or adhesion of dust at the time of washing or forming the insulating film.

Usually, a portion between a light-shielding metal formed above such an abnormal portion and a Si substrate with the abnormal portion interposed therebetween does not have an insulation film structure maintaining an insulation property. In a case where the light-shielding metal has a ground potential and the Si substrate is an N-type substrate, an electric field is generated in a case of being connected to a power supply potential, an electrical short circuit occurs in the abnormal portion having a weak insulation property due to deterioration of reliability, and product characteristics may be deteriorated due to an increase in a standby current of a product or an increase in a dark current of pixels due to light emission at the time of recombination of flowing electrons.

The present disclosure has been achieved in view of such circumstances, and can reduce a product yield and reliability risk.

Solution to Problems

A solid-state imaging apparatus according to an aspect of the present technology includes: a pixel region in which pixels are regularly arranged two-dimensionally; a peripheral circuit region in which a circuit for performing signal processing on an image signal from the pixels is disposed outside the pixel region; a pixel peripheral region disposed between the pixel region and the peripheral circuit region; a first light-shielding material covering the pixel region and connected to a first potential; and a second light-shielding material covering the peripheral circuit region and connected to a second potential which is a potential different from the first potential.

An insulator region surrounding the pixel region is disposed between the first light-shielding material and the second light-shielding material.

At least one of the first light-shielding material and the second light-shielding material contains tungsten, a titanium-containing compound, or aluminum.

An embedded portion formed by digging a surface of a Si substrate in the insulator region is disposed.

The embedded portion is formed by being filled with an insulator.

A film for suppressing incidence of light on a side of the peripheral circuit region is embedded in the Si substrate in a region between the pixel region and the insulator region.

The film for suppressing incidence of light on the side of the peripheral circuit region is constituted by a film having a refractive index different from that of the Si substrate.

The film for suppressing incidence of light on the side of the peripheral circuit region is constituted by a light-shielding film.

The light-shielding film has a laminated structure of an insulator and a light-shielding material.

The light-shielding film contains tungsten, a titanium-containing compound, or aluminum.

The solid-state imaging apparatus is a back-surface solid-state imaging apparatus.

An electronic device according to an aspect of the present technology includes: a solid-state imaging apparatus including a pixel region in which pixels are regularly arranged two-dimensionally, a peripheral circuit region in which a circuit for performing signal processing on an image signal from the pixels is disposed outside the pixel region, and a second light-shielding material covering a v region between the pixel region and the peripheral circuit region and connected to a second potential which is a potential different from the first potential; a signal processing circuit for processing an output signal output from the solid-state imaging apparatus; and an optical system for making incident light incident on the solid-state imaging apparatus.

An aspect of the present technology includes: a pixel region in which pixels are regularly arranged two-dimensionally; a peripheral circuit region in which a circuit for performing signal processing on an image signal from the pixels is disposed outside the pixel region; a pixel peripheral region disposed between the pixel region and the peripheral circuit region; a first light-shielding material covering the pixel region and connected to a first potential; and a second light-shielding material covering the peripheral circuit region and connected to a second potential which is a potential different from the first potential.

Effects of the Invention

According to the present technology, a product yield and reliability risk can be reduced.

Note that effects described here are merely illustrative, and effects of the present technology are not limited to the effects described here, and may include additional effects.

MODE FOR CARRYING OUT THE INVENTION

Hereinafter, modes for carrying out the present disclosure (hereinafter, referred to as embodiments) will be described. Note that the description will be made in the following order.
1. First Embodiment
2. Second embodiment (use example of image sensor)
3. Third Embodiment (example of electronic device)

1. First Embodiment

Schematic Configuration Example of Solid-State Imaging Apparatus

Figure 1:
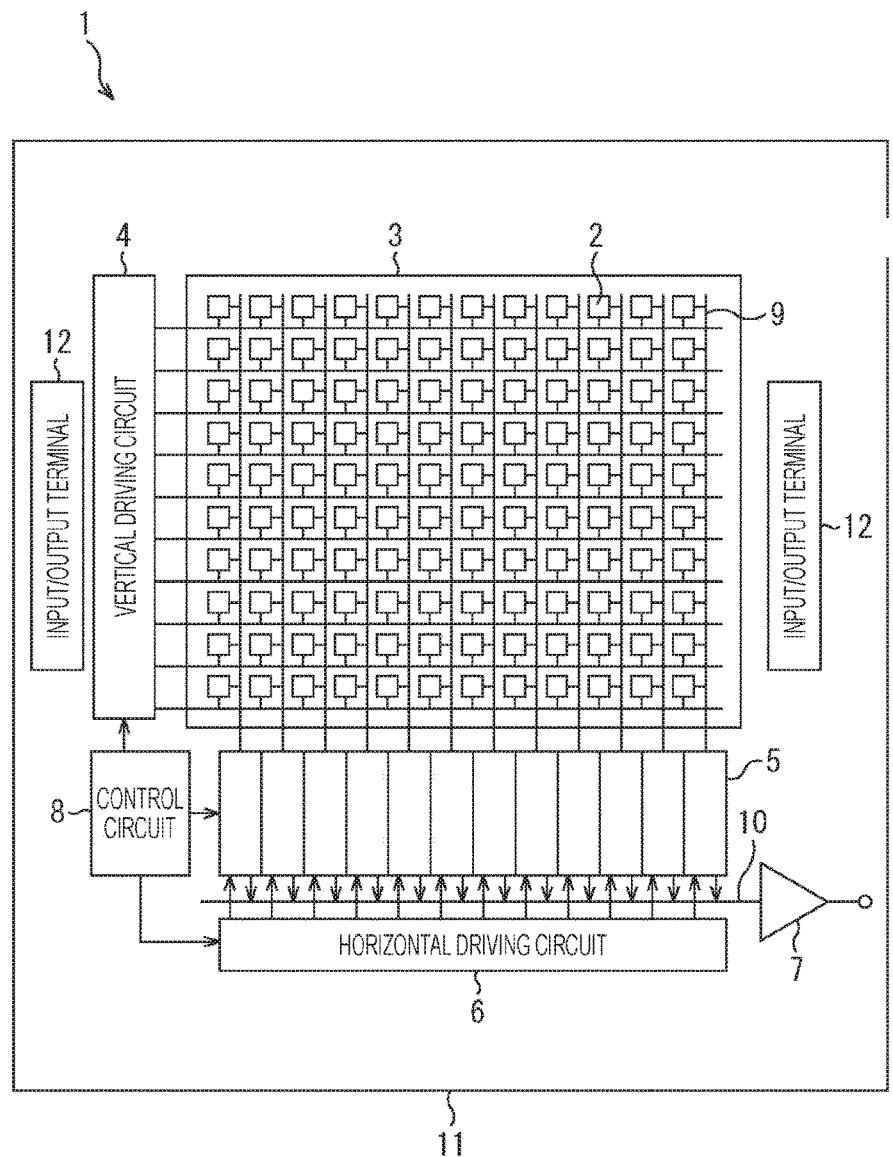
FIG. 1 is a block diagram illustrating a schematic configuration example of a solid-state imaging apparatus to which the present technology is applied.

FIG. 1 illustrates a schematic configuration example of an example of a complementary metal oxide semiconductor (CMOS) solid-state imaging apparatus applied to each embodiment of the present technology.

As illustrated in FIG. 1, a solid-state imaging apparatus (element chip) 1 includes: a pixel region (so-called imaging region) 3 in which a plurality of pixels 2 each including a photoelectric conversion element is regularly arranged two-dimensionally on a semiconductor substrate 11 (for example, a silicon substrate); and a peripheral circuit region.

Each of the pixels 2 includes a photoelectric conversion element (for example, a photodiode), and a plurality of pixel transistors (so-called MOS transistors). The plurality of pixel transistors may include three transistors, for example, a transfer transistor, a reset transistor, and an amplification transistor, and may also include four transistors by further adding a selection transistor. An equivalent circuit of each of the pixels 2 (unit pixel) is similar to a general equivalent circuit, and therefore detailed description thereof will be omitted here.

In addition, each of the pixels 2 may have a pixel sharing structure. The pixel sharing structure includes a plurality of photodiodes, a plurality of transfer transistors, one shared floating diffusion, and another shared pixel transistor. Each of the photodiodes is a photoelectric conversion element.

The peripheral circuit region includes a vertical driving circuit 4, a column signal processing circuit 5, a horizontal driving circuit 6, an output circuit 7, and a control circuit 8.

The control circuit 8 receives data giving a command of an input clock, an operation mode, or the like, and outputs data of internal information or the like of the solid-state imaging apparatus 1. Specifically, the control circuit 8 generates a clock signal and a control signal serving as references for operations of the vertical driving circuit 4, the column signal processing circuit 5, and the horizontal driving circuit 6 on the basis of a vertical synchronization signal, a horizontal synchronization signal, and a master clock. Then, the control circuit 8 inputs these signals to the vertical driving circuit 4, the column signal processing circuit 5, and the horizontal driving circuit 6.

The vertical driving circuit 4 includes, for example, a shift register, selects pixel driving wiring, supplies a pulse for driving the pixels 2 to the selected pixel driving wiring, and drives the pixels 2 in units of rows. Specifically, the vertical driving circuit 4 sequentially selects and scans each of the pixels 2 in the pixel region 3 in units of rows in a vertical direction, and supplies a pixel signal based on a signal charge generated in accordance with the amount of light received in a photoelectric conversion element of each of the pixels 2 to the column signal processing circuit 5 through a vertical signal line 9.

The column signal processing circuit 5 is disposed, for example, for each of columns of the pixels 2, and performs signal processing such as removal of a noise for a signal output from the pixels 2 in one row for each of the pixel columns. Specifically, the column signal processing circuit 5 performs signal processing such as correlated double sampling (CDS) for removing a fixed pattern noise peculiar to the pixels 2, signal amplification, or analog/digital (A/D) conversion. In an output stage of the column signal processing circuit 5, a horizontal selection switch (not illustrated) is connected and disposed between the column signal processing circuit 5 and a horizontal signal line 10.

The horizontal driving circuit 6 includes, for example, a shift register, sequentially selects each of the column signal processing circuits 5 by sequentially outputting a horizontal scan pulse, and causes each of the column signal processing circuits 5 to output a pixel signal to the horizontal signal line 10.

The output circuit 7 performs signal processing on a signal sequentially supplied from each of the column signal processing circuits 5 through the horizontal signal line 10, and outputs the processed signal. For example, the output circuit 7 performs only buffering, or performs black level adjustment, column variation correction, various types of digital signal processing, and the like.

An input/output terminal 12 is disposed for exchanging signals with an outside.

Configuration Example of Solid-State Imaging Apparatus

Figure 2:
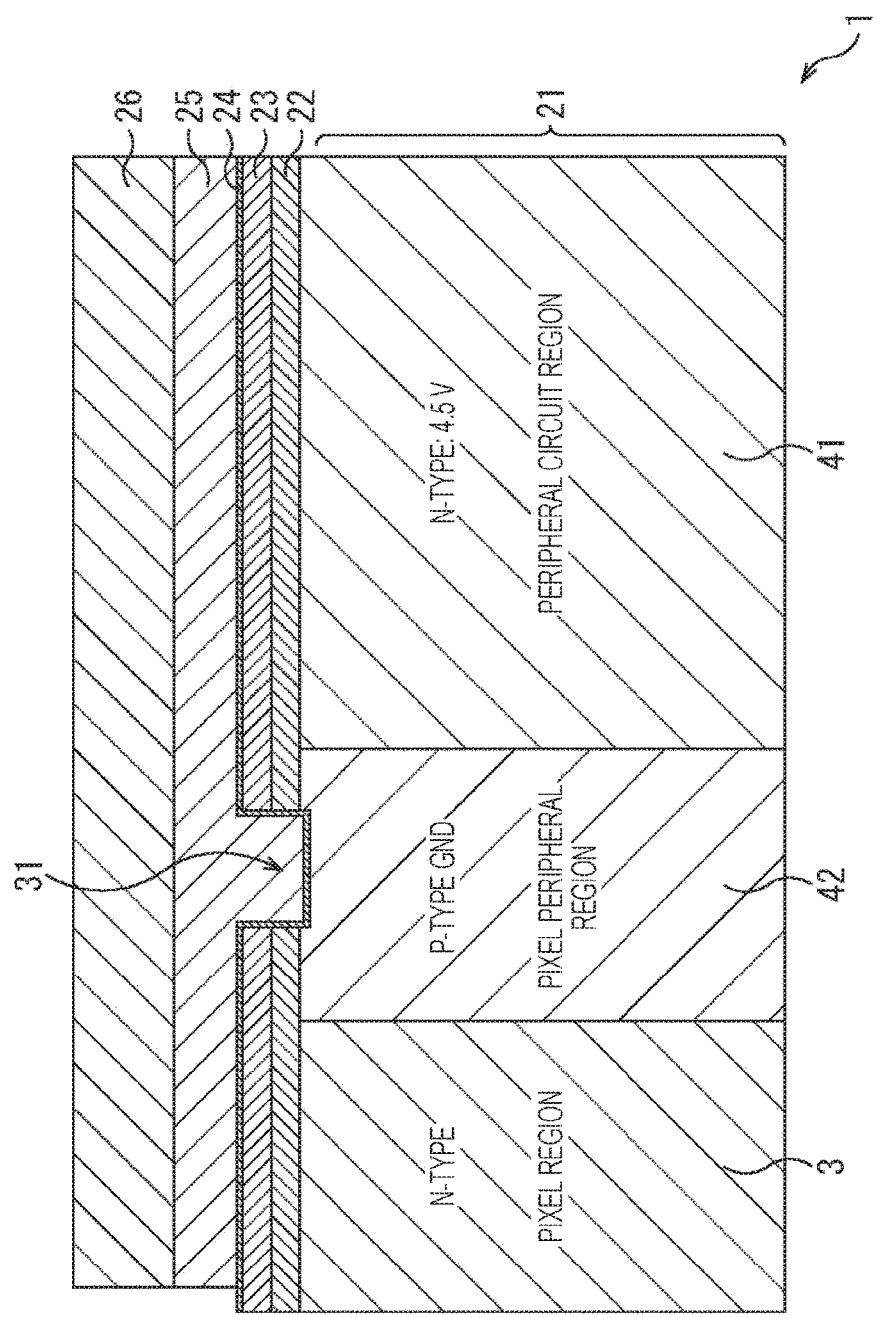
FIG. 2 is a cross-sectional view illustrating a configuration example of a solid-state imaging apparatus.

FIG. 2 is a cross-sectional view illustrating a configuration example of a solid-state imaging apparatus in a case where an electric field is constantly applied to an insulating film between an N-type substrate and a light-shielding metal connected to the ground. In the example of FIG. 2, a back-surface solid-state imaging apparatus is exemplified. In addition, although not described in the example of FIG. 2, actually, in the solid-state imaging apparatus 1, a wiring layer such as a transistor is disposed in a lower part in FIG. 2.

In the solid-state imaging apparatus 1 of the example of FIG. 2, using an N-type Si substrate 21, a P-type pixel peripheral region 42 having a certain width is formed between the N-type pixel region 3 and an N-type peripheral circuit region 41 such that there is no electrical or optical influence on the pixel region 3.

In a case where the pixels 2 and a peripheral circuit are formed on the same surface of the Si substrate 21, a structure is applied in which the peripheral circuit region 41 is covered by a light-shielding material, generally a metal (hereinafter, referred to as a light-shielding metal) 25 such that light is incident only on the pixel region 3. Specifically, on the Si substrate 21, an insulating film 22 having a fixed charge in the film, an insulating film 23 containing, for example, SiO2, a metal layer 24, a light-shielding metal 25, and an insulating film 26 are formed in order from a bottom. The light-shielding metal 25 contains, for example, tungsten, a titanium-containing compound, or aluminum.

The pixel peripheral region 42 is previously connected to the ground (GND) so as not to be charged during processing. By forming an opening 31 in the insulating films 22 and 23 on a back surface of the pixel peripheral region 42 to form a contact, the light-shielding metal 25 can be connected to the ground (GND).

In the N-type substrate, a power supply voltage (for example, 4.5 V) which is a positive voltage is applied to the peripheral circuit region 41 in order to form a PN junction which is usually an electrical isolation region in the Si substrate 21. Therefore, an electric field is constantly applied to the insulating film 23 between the positively charged N-type Si substrate 21 and the light-shielding metal 25 connected to the ground (GND).

Configuration Example of Solid-State Imaging Apparatus

Figure 3:
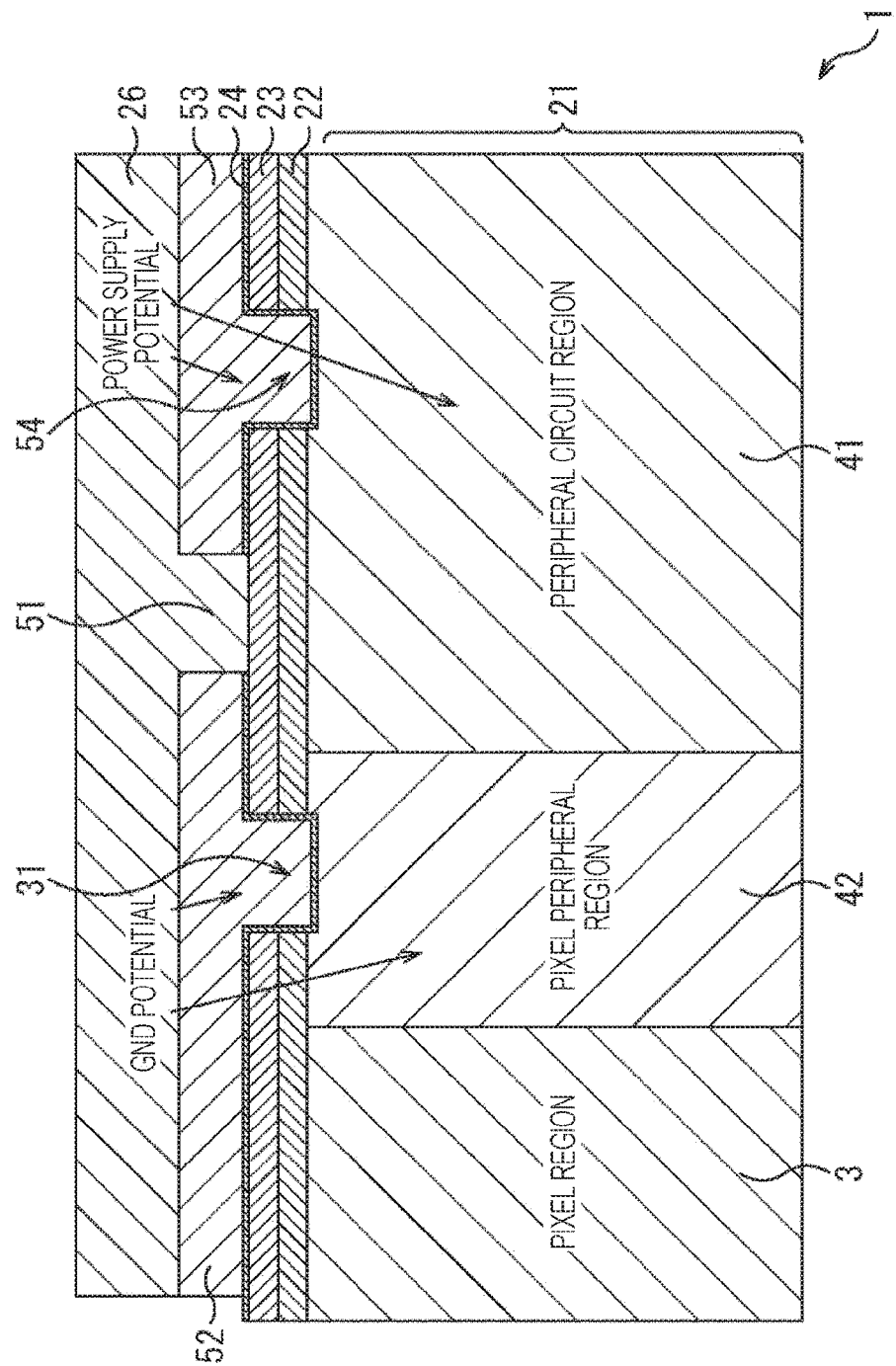
FIG. 3 is a cross-sectional view illustrating a first configuration example of the solid-state imaging apparatus of the present technology.

FIG. 3 is a cross-sectional view illustrating a first configuration example of the solid-state imaging apparatus of the present technology.

The solid-state imaging apparatus 1 of FIG. 3 is the same as the solid-state imaging apparatus 1 of FIG. 2 in that the insulating film 22, the insulating film 23, the metal layer 24, and the insulating film 26 are formed on the Si substrate 21, and that the opening 31 is formed in the insulating films 22 and 23 on a back surface of the pixel peripheral region 42 to form a contact.

The solid-state imaging apparatus 1 of FIG. 3 is different from the solid-state imaging apparatus 1 of FIG. 2 in that a light-shielding metal 52 is formed on the pixel region 3 and a light-shielding metal 53 is formed on the peripheral circuit region 41 instead of the light-shielding metal 25, that an insulating region 51 is formed between the light-shielding metals 52 and 53, and that an opening 54 is formed in the insulating films 22 and 23 on a back surface of the peripheral circuit region 41 to form a contact. Like the light-shielding metal 25, each of the light-shielding metals 52 and 53 contains, for example, tungsten, a titanium-containing compound, or aluminum. Note that the light-shielding metal 52 may contain the same material as the light-shielding metal 53, or does not have to contain the same material as the light-shielding metal 53.

That is, in the example of FIG. 3, by setting the light-shielding metal 53 on the peripheral circuit region 41 and the Si substrate 21 to the same potential, application of an electric field to the insulating films 22 and 23 between the light-shielding metal 53 and the Si substrate 21 is prevented.

Therefore, by forming a contact by forming the opening 54 in the insulating films 22 and 23 on a back surface of the peripheral circuit region 41 without connecting the light-shielding metal 53 on the peripheral circuit region 41 to the ground (GND), the light-shielding metal 53 is connected to the Si substrate 21. Furthermore, the light-shielding metal 52 on the pixel region 3 is connected to the ground (GND). Therefore, by disposing the isolated region (insulating region) 51 where no metal is formed between the light-shielding metal 52 and the light-shielding metal 53 on the peripheral circuit region 41, the light-shielding metal 52 does not cause a short circuit with the light-shielding metal 53 on the peripheral circuit region 41.

By applying this structure and layout, in a part of the insulating films 22 and 23 between the light-shielding metal 53 on the peripheral circuit region 41 and the Si substrate 21, for example, even if a portion having a low insulator pressure is generated due to abnormality of underlying Si surface and dust in the insulating films, a current does not flow between the light-shielding metal 53 and the Si substrate 21 because the light-shielding metal 53 has the same potential as the Si substrate 21. In addition, in connection with the ground (GND), a PN junction is formed between the P-type region of the pixel region 3 in the Si substrate 21 and the N-type region of the peripheral circuit region 41, and a current equal to or larger than junction leakage is not generated.

Figure 4:
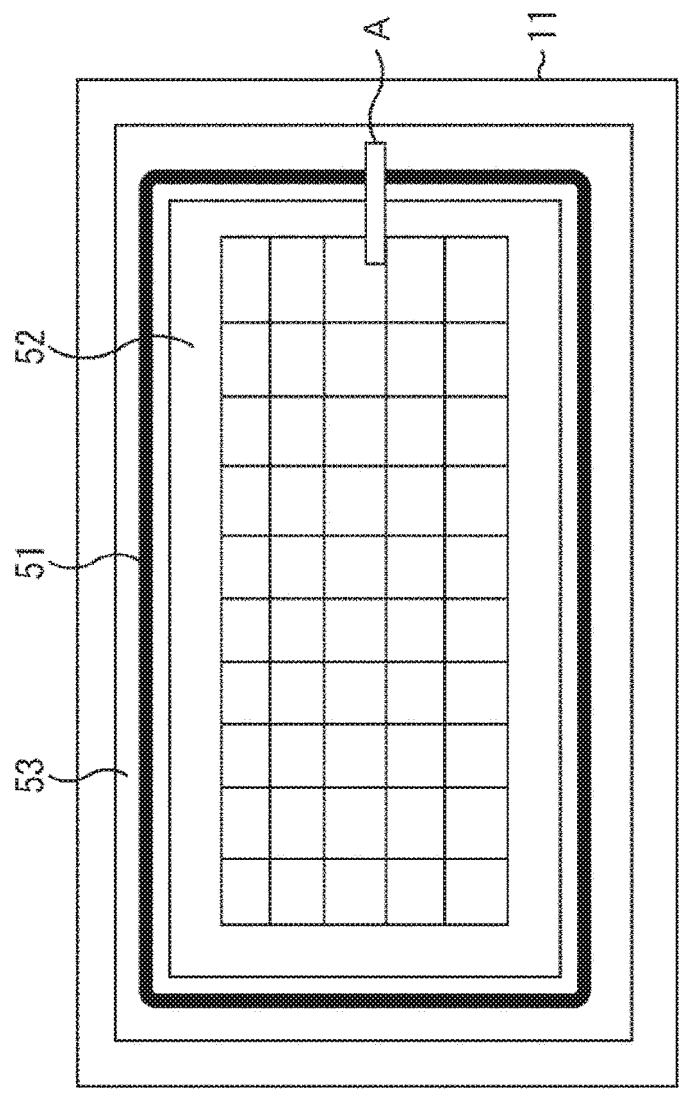
FIG. 4 is a plan view of the solid-state imaging apparatus of FIG. 1 as viewed from above.

FIG. 4 is a plan view of a back side of the solid-state imaging apparatus of FIG. 3. Incidentally, the cross-sectional view of the solid-state imaging apparatus of FIG. 3 illustrates an example of a cross section indicated by A in the example of FIG. 4.

As illustrated in FIG. 4, the light-shielding metal 52 on the pixel region 3 is isolated from the light-shielding metal 53 on the peripheral circuit region 41 by the insulating region 51.

Configuration Example of Solid-State Imaging Apparatus

Figure 5:
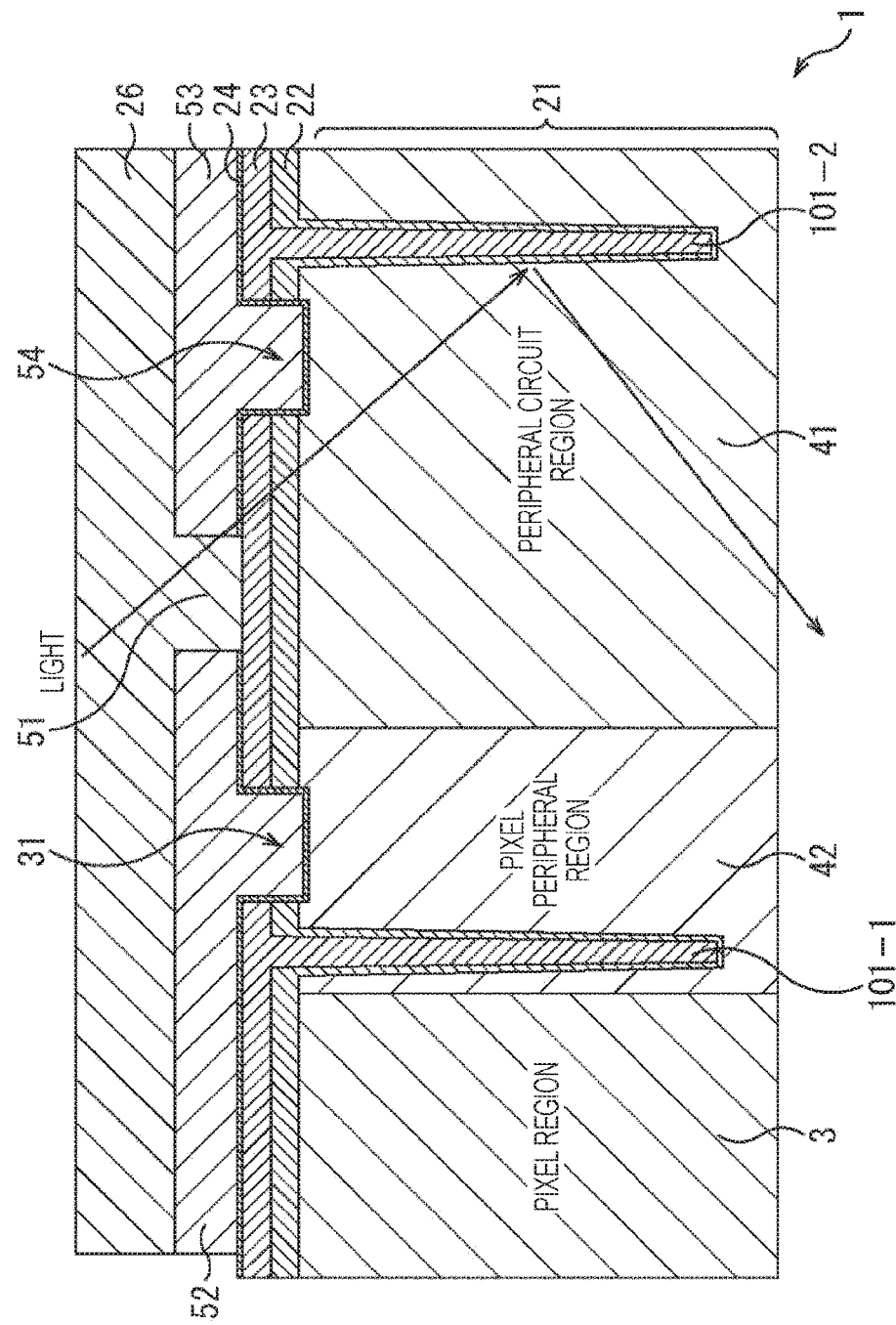
FIG. 5 is a cross-sectional view illustrating a second configuration example of the solid-state imaging apparatus of the present technology.

FIG. 5 is a cross-sectional view illustrating a second configuration example of the solid-state imaging apparatus of the present technology.

The solid-state imaging apparatus 1 of FIG. 5 is the same as the solid-state imaging apparatus 1 of FIG. 3 in that the insulating film 22, the insulating film 23, the metal layer 24, the light-shielding metals 52 and 53, the insulating region 51, and the insulating film 26 are formed on the Si substrate 21 in order from a bottom, and that the opening 31 is formed in the insulating films 22 and 23 on a back surface of the pixel peripheral region 42 to form a contact and the opening 54 is formed in the insulating films 22 and 23 on a back surface of the peripheral circuit region 41 to form a contact.

The solid-state imaging apparatus 1 of FIG. 5 is different from the solid-state imaging apparatus 1 of FIG. 3 in that a light-shielding film 101-1 is embedded in the pixel peripheral region 42 and a light-shielding film 101-2 is embedded in the peripheral circuit region 41.

The solid-state imaging apparatus 1 of FIG. 5 is the same as the solid-state imaging apparatus 1 of FIG. 3 in that the insulating region 51 is formed between the light-shielding metal 52 on the pixel region 3 and the light-shielding metal 53 on the peripheral circuit region 41 instead of the light-shielding metal 25, and that the opening 54 is formed in the insulating films 22 and 23 on a back surface of the peripheral circuit region 41 to form a contact.

Incidentally, in a case where it is not necessary to particularly distinguish the light-shielding films 101-1 and 101-2 from each other, the light-shielding films 101-1 and 101-2 are collectively referred to as a light-shielding film 101.

Here, in the configuration illustrated in the example of FIG. 3, the electrically insulating region 51 is disposed between the light-shielding metal 53 connected to the Si substrate of a power supply voltage and the light-shielding metal 52 connected to the ground on the pixel region 3. However, actually, in order to form the insulating region 51, the insulating region 51 which is a non-light-shielding region is disposed in a portion usually covered by the light-shielding metal. Therefore, at the time of entrance of light, light enters the pixels 2 and a device region inside the peripheral circuit, and photoelectrically converted electrons may affect device characteristics.

One of measures therefor is to dispose an opening sufficiently apart from the device region. However, as illustrated in FIG. 5, as a light-shielding material or a film having a different refractive index from that of Si, the light-shielding films 101-1 and 101-2 can also be disposed. As a result, a structure in which incident light is totally reflected or incident light is refracted such that the light hardly enters a side of the device region is possible.

Each of the light-shielding films 101-1 and 101-2 may be, for example, a metal film such as tungsten, a titanium-containing compound, or aluminum, or for example, an SiO2 film as a film having a different refractive index from that of Si. In addition, each of the light-shielding films 101-1 and 101-2 may have a laminated structure of an insulator and a light-shielding material. In this case, the light-shielding material may be, for example, a metal film such as tungsten, a titanium-containing compound, or aluminum, or for example, an SiO2 film as a film having a different property from that of Si.

Incidentally, the example of FIG. 5 illustrates an example in which one light-shielding film 101 is formed on each of left and right sides of the insulating region 51, that is, one light-shielding film 101 is formed on each of a side of the pixel region 3 and a side of the peripheral circuit region 41. However, a plurality of light-shielding films 101 may be disposed as long as being disposed outside the pixel region 3.

This makes it possible to suppress enter of light directly into the side of the pixel region 3 and the side of the peripheral circuit region 41 even if light enters from a region from which the light-shielding metal is isolated. As a result, stable device characteristics and peripheral circuit operation can be obtained.

Configuration Example of Solid-State Imaging Apparatus

Figure 6:
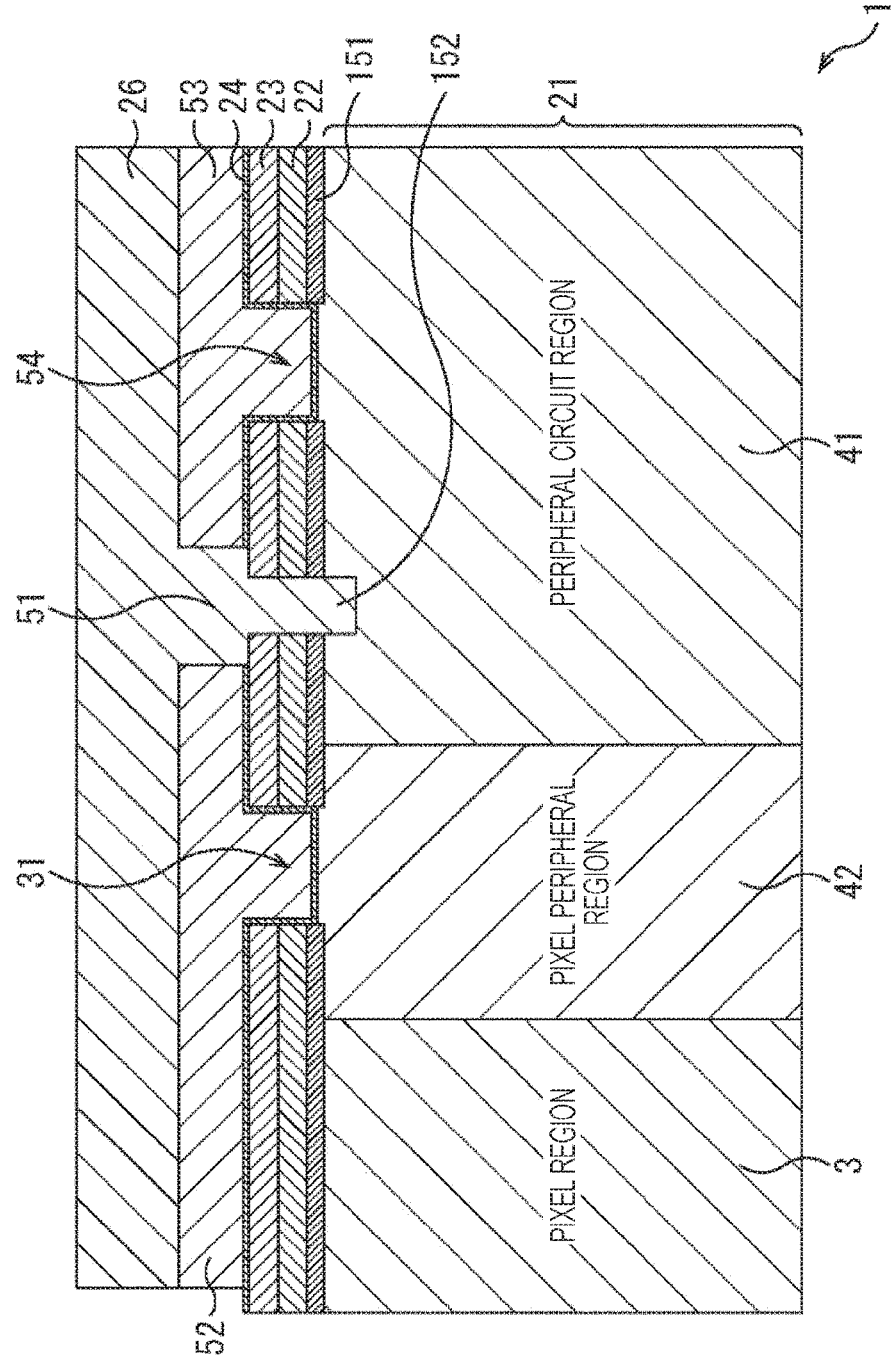
FIG. 6 is a cross-sectional view illustrating a third configuration example of the solid-state imaging apparatus of the present technology.

FIG. 6 is a cross-sectional view illustrating a third configuration example of the solid-state imaging apparatus of the present technology.

The solid-state imaging apparatus 1 of FIG. 6 is the same as the solid-state imaging apparatus 1 of FIG. 3 in that the insulating film 22, the insulating film 23, the metal layer 24, the light-shielding metals 52 and 53, the insulating region 51, and the insulating film 26 are formed on the Si substrate 21 in order from a bottom, and that the opening 31 is formed in the insulating films 22 and 23 on a back surface of the pixel peripheral region 42 to form a contact and the opening 54 is formed in the insulating films 22 and 23 on a back surface of the peripheral circuit region 41 to form a contact.

The solid-state imaging apparatus 1 of FIG. 6 is different from the solid-state imaging apparatus 1 of FIG. 3 in that a Si substrate embedded portion 152 is embedded in the peripheral circuit region 41. Incidentally, in the example of FIG. 6, a P-type inversion layer 151 is described between the Si substrate 21 and the insulating film 22 for convenience of explanation. This P-type inversion layer 151 is formed on a back surface Si interface all the time by the insulating film 22 having a negative fixed charge, and is not particularly described in the examples of FIGS. 3 and 5, but is actually formed on a back surface Si interface all the time also in the examples of FIGS. 3 and 5.

In order to isolate the P-type inversion layer 151 in the peripheral circuit region 41 outside the pixel peripheral region 42, the Si substrate embedded portion 152 is dry etched so as to dig the Si substrate 21 and is formed by being filled with an insulating film. That is, for example, a part of the P inversion layer 151 formed on a back surface interface where electrons generated at a 4.5 V contact flow from a 4.5 V side to a ground side to a GND side is cut. Particularly, it is effective at high voltage conditions (for example, 4.5 V or higher).

Here, by applying a configuration in which dark current characteristics of pixels due to charges generated by an interface state by forming the insulating film 22 which is a film having fixed charges on a back surface Si surface and modulating a potential of the back surface Si surface, the peripheral circuit region 41 is connected to the pixels 2 by the P-type inversion layer 151 generated by modulating the back surface Si surface.

In a case where the degree of modulation of the P-type inversion layer 151 is deteriorated due to fluctuation of a fixed charge amount in a film formed on a back surface due to aged deterioration of a product, abnormality of Si surface, or film quality abnormality of an insulating film, charges due to an influence of an interface state may increase, and may flow as a leakage current via the P-type inversion layer 151. If the amount is large, a dark current as pixel characteristics may be deteriorated due to a standby consumption current of a product or light emission.

Therefore, by adopting a structure in which the Si substrate embedded portion 152 is formed by dry etching so as to dig the Si substrate 21 to isolate the P-type inversion layer 151, it is possible to block a leak path through which charges generated at an interface flow. Therefore, it is possible to suppress the standby consumption current of a product and deterioration of the dark current as pixel characteristics due to light emission.

Incidentally, in the above description, the example using an Nsub substrate as the Si substrate 21 has been described, but the present technology can also be applied to a case of using a Psub substrate.

Configuration Example of Solid-State Imaging Apparatus

Figure 7:
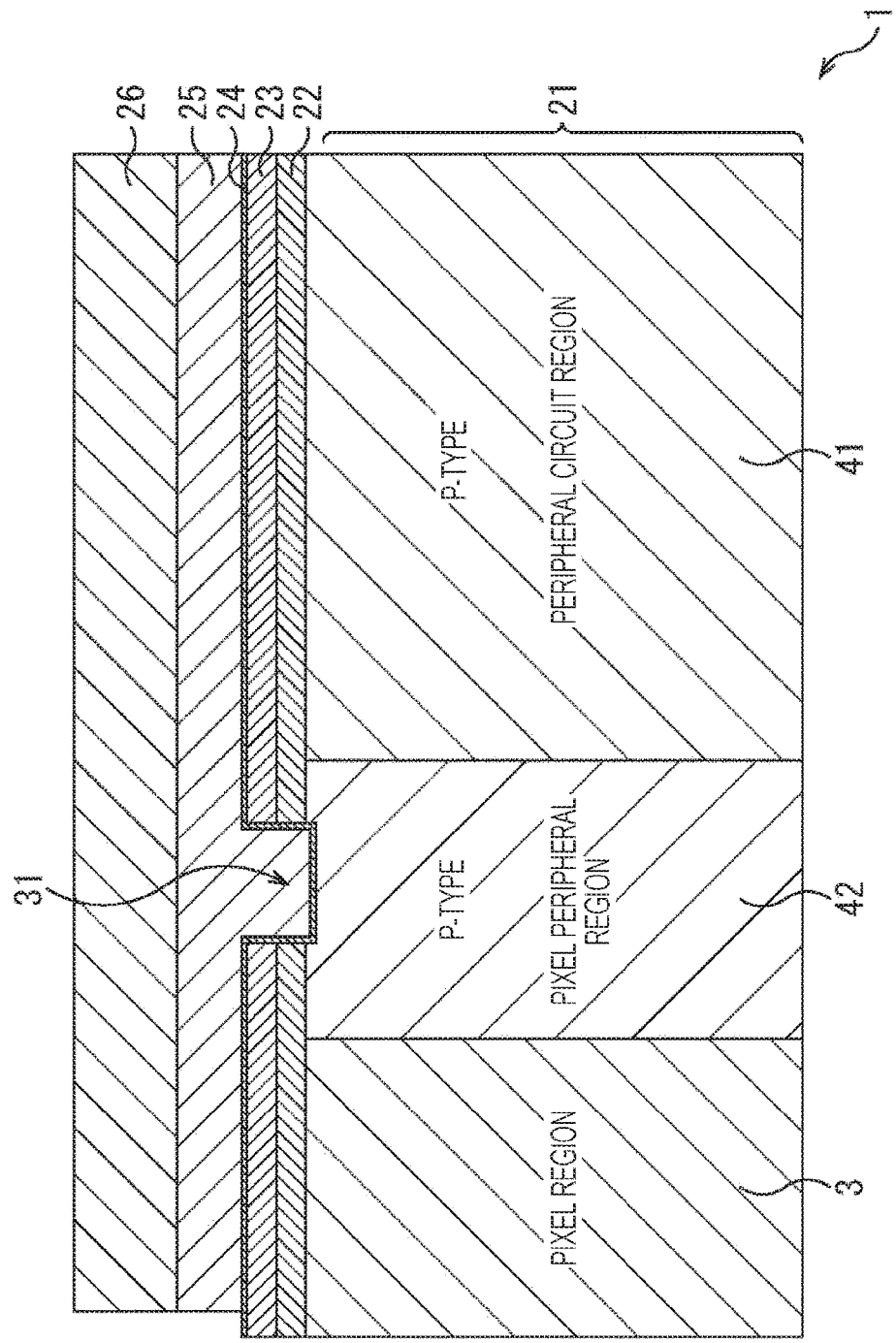
FIG. 7 is a cross-sectional view illustrating a fourth configuration example of the solid-state imaging apparatus of the present technology.

FIG. 7 is a cross-sectional view illustrating a fourth configuration example of the solid-state imaging apparatus of the present technology.

The solid-state imaging apparatus 1 of FIG. 7 is the same as the solid-state imaging apparatus 1 of FIG. 3 in that the insulating film 22, the insulating film 23, the metal layer 24, the light-shielding metal 25, the insulating region 51, and the insulating film 26 are formed on the Si substrate 21 in order from a bottom, and that the opening 31 is formed in the insulating films 22 and 23 on a back surface of the pixel peripheral region 42 to form a contact.

The solid-state imaging apparatus 1 of FIG. 7 is different from the solid-state imaging apparatus 1 of FIG. 3 in that a Psub substrate is used as the Si substrate 21.

That is, in this case, similarly to the pixel peripheral region 42 of the Si substrate 21, the peripheral circuit region 41 is a P-type region. Therefore, the light-shielding metal 25 on the peripheral circuit region 41 and the Si substrate 21 are connected to the ground without applying the structures of the examples of FIGS. 3 to 6 (examples using an Ndub substrate).

As described above, the present technology adopts a structure in which the light-shielding metal on a back surface has the same potential as a substrate under the light-shielding metal.

By applying the present technology as described above, in a part of an insulating film between a light-shielding metal on a peripheral circuit and a Si substrate, for example, even if a portion having low insulation resistance is generated due to abnormality of underlying Si surface and dust in the insulating film, a current does not flow between the light-shielding metal and the Si substrate because the light-shielding metal has the same potential as the Si substrate. In connection with the ground (GND), a PN junction is formed between a P-type region of a pixel region in the Si substrate and an N-type region of a peripheral circuit region, and a current equal to or larger than junction leakage is not generated.

In the peripheral circuit region, no electric field is applied between the light-shielding metal and the substrate, and therefore no short circuit occurs in principle. Therefore, it is possible to reduce a product yield and reliability risk due to abnormality of Si surface and generation of dust occurring in steps up to formation of the light-shielding metal in a back surface step.

Incidentally, in the above description, an example of the back-surface solid-state imaging apparatus has been described, but the present technology can also be applied to a front-surface solid-state imaging apparatus.

In addition, in the above description, the configuration in which the present technology is applied to a CMOS solid-state imaging apparatus has been described, but the present technology may be applied to a solid-state imaging apparatus such as a charge coupled device (CCD) solid-state imaging apparatus.

2. Second Embodiment (Use Example of Image Sensor)

Figure 8:
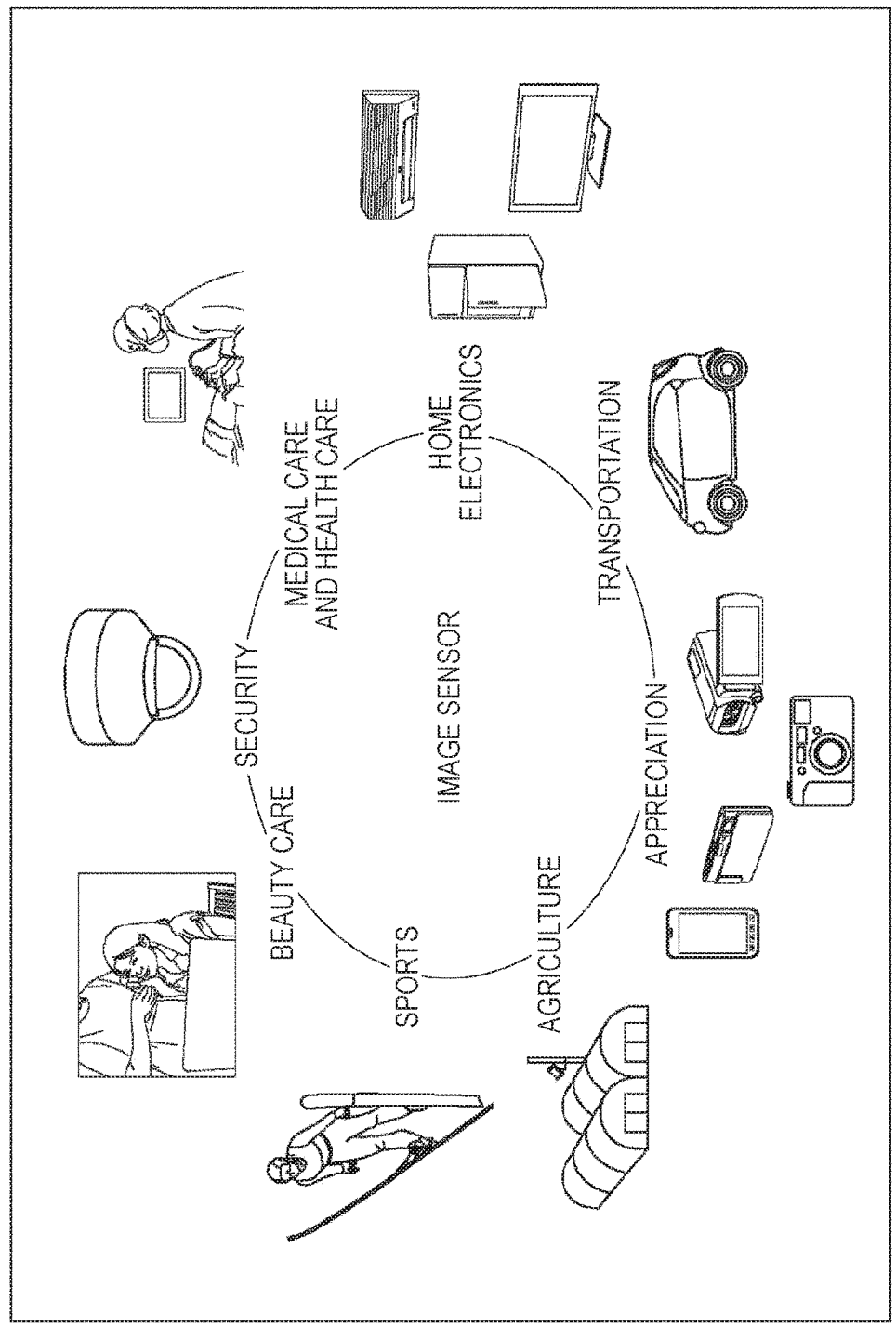
FIG. 8 is a diagram illustrating a use example of an image sensor to which the present technology is applied.

FIG. 8 is a diagram illustrating a use example using the above solid-state imaging apparatus.

The above solid-state imaging apparatus (image sensor) can be used in various cases of sensing light such as visible light, infrared light, ultraviolet light, or an X-ray, for example, as described below.

An apparatus for imaging an image used for appreciation, such as a digital camera or a portable device with a camera function A device used for transportation, such as a vehicle-mounted sensor for imaging the front, the back, the surrounding, the inside, or the like of an automobile for safe driving such as automatic stop, for recognition of a driver's condition, and the like, a surveillance camera for monitoring a running vehicle and a road, or a measuring sensor for measuring a distance between vehicles or the like An apparatus used for home electronics, such as a television set, a refrigerator, or an air conditioner for imaging a gesture of a user and operating a device according to the gesture An apparatus used for medical care and health care, such as an endoscope or an apparatus for receiving infrared light for angiography An apparatus used for security, such as a surveillance camera for crime prevention or a camera for personal authentication An apparatus used for beauty care, such as a skin measurement device for imaging a skin or a microscope for imaging a scalp An apparatus used for sports, such as an action camera or a wearable camera for sports or the like An apparatus used for agriculture, such as a camera for monitoring a condition of a field and a crop 3. Third Embodiment (Example of Electronic Device)

Configuration Example of Electronic Device

Furthermore, the present technology is not limited to application to a solid-state imaging apparatus, but can also be applied to an imaging apparatus. Here, the imaging apparatus refers to a camera system such as a digital still camera or a digital video camera, or an electronic device having an imaging function, such as a mobile phone. Note that there is a case where a module form mounted on an electronic device, that is, a camera module is used as an imaging apparatus.

Here, a configuration example of the electronic device of the present technology will be described with reference to FIG. 9.

Figure 9:
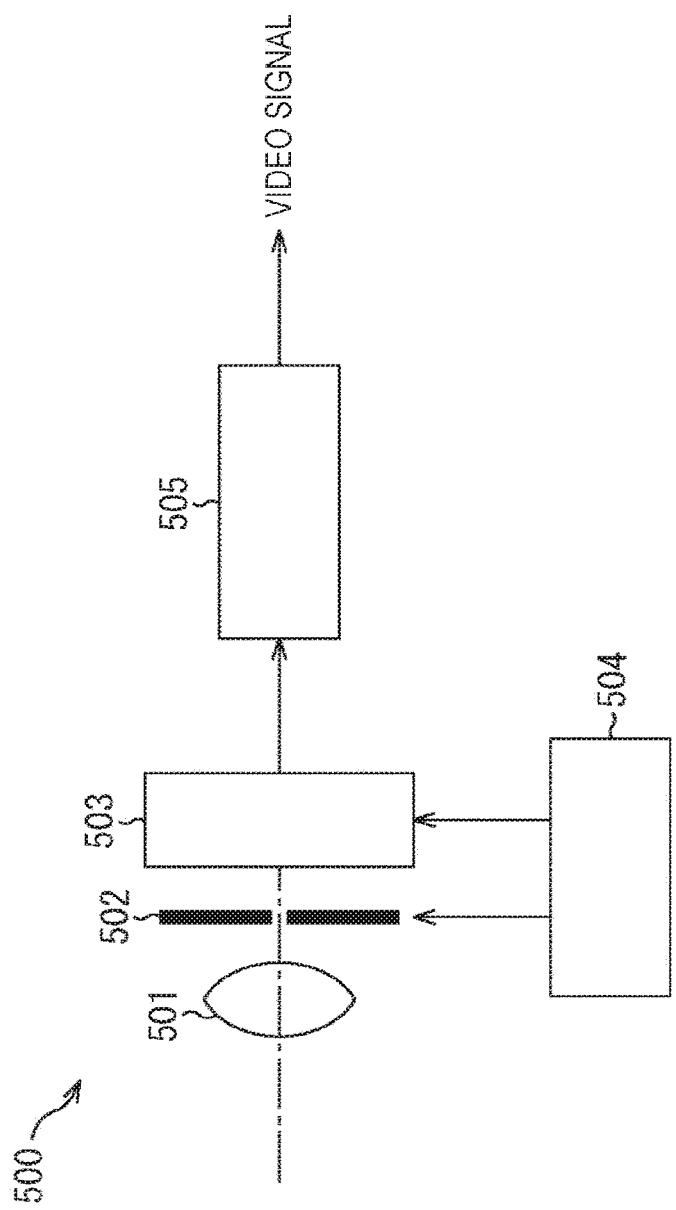
FIG. 9 is a block diagram illustrating a configuration example of an electronic device to which the present technology is applied.

An electronic device 500 illustrated in FIG. 9 includes a solid-state imaging apparatus (element chip) 501, an optical lens 502, a shutter apparatus 503, a driving circuit 504, and a signal processing circuit 505. As the solid-state imaging apparatus 501, the solid-state imaging apparatus 1 according to the first embodiment of the present technology described above is disposed. As a result, a product yield and reliability risk of the solid-state imaging apparatus 501 of the electronic device 500 can be reduced.

The optical lens 502 forms an image of image light (incident light) from a subject on an imaging surface of the solid-state imaging apparatus 501. As a result, a signal charge is accumulated in the solid-state imaging apparatus 501 for a certain period of time. The shutter apparatus 503 controls a light irradiation period and a light-shielding period for the solid-state imaging apparatus 501.

The driving circuit 504 supplies a driving signal for controlling signal transfer operation of the solid-state imaging apparatus 501 and shutter operation of the shutter apparatus 503. The solid-state imaging apparatus 501 transfers a signal by a driving signal (timing signal) supplied from the driving circuit 504. The signal processing circuit 505 performs various types of signal processing on the signal output from the solid-state imaging apparatus 501. A video signal which has been subjected to signal processing is stored in a storage medium such as a memory or is output to a monitor.

Incidentally, here, steps describing a series of processes described above include of course processing performed chronologically according to the described order, and also include processing performed in parallel or individually without being chronologically.

In addition, the embodiments in the present disclosure are not limited to the above embodiments, but various changes can be made thereto without departing from the gist of the present disclosure.

In addition, the configuration described as one apparatus (or processing unit) in the above description may be divided into a plurality of apparatuses (or processing units). On the contrary, the configurations described as a plurality of apparatuses (or processing units) in the above description may be collected to constitute one apparatus (or processing unit). In addition, needles to say, a configuration other than those described above may be added to the configuration of each apparatus (or each processing unit). Furthermore, as long as the configuration and operation of an entire system are substantially the same, a part of a configuration of a certain apparatus (or a certain processing unit) may be included in a configuration of another apparatus (or another processing unit). That is, the present technology is not limited to the above embodiments, but various changes can be made thereto without departing from the gist of the present technology.

Hitherto, preferable embodiments of the present disclosure have been described in detail with reference to the accompanying drawings, but the disclosure is not limited to such examples. It is obvious that a person having ordinary knowledge in the technical field to which the present disclosure belongs can conceive of various change examples and modification examples within a range of the technical idea described in the claims, and it is understood that these change examples and modification examples naturally belong to the technical scope of the present disclosure.

Note that the present technology can have the following configurations.

(1) A solid-state imaging apparatus including:
a pixel region in which pixels are regularly arranged two-dimensionally;
a peripheral circuit region in which a circuit for performing signal processing on an image signal from the pixels is disposed outside the pixel region;
a pixel peripheral region disposed between the pixel region and the peripheral circuit region;
a first light-shielding material covering the pixel region and connected to a first potential; and
a second light-shielding material covering the peripheral circuit region and connected to a second potential which is a potential different from the first potential.

(2) The solid-state imaging apparatus according to (1), in which
an insulator region surrounding the pixel region is disposed between the first light-shielding material and the second light-shielding material.

(3) The solid-state imaging apparatus according to (1) or (2), in which
at least one of the first light-shielding material and the second light-shielding material contains tungsten, a titanium-containing compound, or aluminum.

(4) The solid-state imaging apparatus according to any one of (1) to (3), in which
an embedded portion formed by digging a surface of a Si substrate in the insulator region is further formed.

(5) The solid-state imaging apparatus according to (4), in which
the embedded portion is formed by being filled with an insulator.

(6) The solid-state imaging apparatus according to any one of (1) to (4), in which
an embedded light-shielding film is embedded in a Si substrate in a region between the pixel region and the insulator region.

(7) The solid-state imaging apparatus according to (6), in which
the film for suppressing incidence of light on a side of the peripheral circuit region is constituted by a film having a refractive index different from that of the Si substrate.

(8) The solid-state imaging apparatus according to (6), in which
the film for suppressing incidence of light on a side of the peripheral circuit region is constituted by a light-shielding film.

(9) The solid-state imaging apparatus according to (8), in which
the light-shielding film has a laminated structure of an insulator and a light-shielding material.

(10) The solid-state imaging apparatus according to (8), in which
the light-shielding film contains tungsten, a titanium-containing compound, or aluminum.

(11) The solid-state imaging apparatus according to any one of (1) to (10), in which
the solid-state imaging apparatus is a back-surface solid-state imaging apparatus.

(12) An electronic device including:
a solid-state imaging apparatus including:
pixels regularly arranged two-dimensionally; and
a vertical addition circuit for outputting only either one of pixels to be vertically added in a case where one of the pixels to be vertically added is a special pixel having a function other than imaging at the time of vertical addition;
a signal processing circuit for processing an output signal output from the solid-state imaging apparatus; and
an optical system for making incident light incident on the solid-state imaging apparatus.

REFERENCE SIGNS LIST

1 Solid-state imaging apparatus
2 Pixel
3 Pixel region
4 Vertical driving circuit
9 Vertical signal line 21 Si substrate
22 Insulating film
23 Insulating film
24 Metal layer
25 Light-shielding metal
26 Insulating film
31 Opening
41 Peripheral circuit region
42 Pixel peripheral region
51 Insulating region
52 Light-shielding metal
53 Light-shielding metal
54 Opening
101, 101-1, 101-2 Light-shielding film
151 P-type inversion layer
152 Si substrate embedded portion
500 Electronic device
501 Solid-state imaging apparatus
502 Optical lens
503 Shutter apparatus
504 Driving circuit
505 Signal processing circuit

The invention claimed is:

1. A solid-state imaging apparatus, comprising:
a pixel region that includes a plurality of pixels in a two-dimension arrangement;
a peripheral circuit region that includes a circuit outside the pixel region, wherein the circuit is configured to execute a signal processing operation on an image signal from the plurality of pixels;
a pixel peripheral region between the pixel region and the peripheral circuit region;
a plurality of insulating films on a surface of the pixel peripheral region, wherein the plurality of insulating films includes an opening;
a first light-shielding material that covers the pixel region and the pixel peripheral region,
wherein the first light-shielding material is connected to a first potential, and
wherein the opening connects the pixel peripheral region and the first light-shielding material; and
a second light-shielding material that covers the peripheral circuit region and is connected to a second potential that is different from the first potential.

2. The solid-state imaging apparatus according to claim 1, further comprising an insulator region that surrounds the pixel region and is between the first light-shielding material and the second light-shielding material.

3. The solid-state imaging apparatus according to claim 1, wherein at least one of the first light-shielding material or the second light-shielding material includes one of tungsten, a titanium-containing compound, or aluminum.

4. The solid-state imaging apparatus according to claim 1, wherein the solid-state imaging apparatus corresponds to a back-surface solid-state imaging apparatus.

5. The solid-state imaging apparatus according to claim 2, further comprising:
a film embedded in a silicon (Si) substrate in a region between the pixel region and the insulator region, wherein the film suppresses incident light on a side of the peripheral circuit region.

6. The solid-state imaging apparatus according to claim 5, wherein a refractive index of the film is different from a refractive index of the Si substrate.

7. The solid-state imaging apparatus according to claim 5, wherein the film corresponds to a light-shielding film.

8. The solid-state imaging apparatus according to claim 7, wherein the light-shielding film has a laminated structure that includes an insulator and a light-shielding material.

9. The solid-state imaging apparatus according to claim 7, wherein the light-shielding film includes one of tungsten, a titanium-containing compound, or aluminum.

10. The solid-state imaging apparatus according to claim 2, further comprising:
an embedded portion on a surface of a silicon (Si) substrate in the insulator region.

11. The solid-state imaging apparatus according to claim 10, wherein the embedded portion includes an insulator.

12. An electronic device, comprising:
a solid-state imaging apparatus including:
a pixel region that includes a plurality of pixels in a two-dimension arrangement;
a peripheral circuit region that includes a circuit outside the pixel region, wherein the circuit is configured to execute a signal processing operation on an image signal from the plurality of pixels;
a pixel peripheral region between the pixel region and the peripheral circuit region;
a plurality of insulating films on a surface of the pixel peripheral region, wherein the plurality of insulating films includes an opening;
a first light-shielding material that covers the pixel region and the pixel peripheral region,
wherein the first light-shielding material is connected to a first potential, and
wherein the opening connects the pixel peripheral region and the first light-shielding material; and
a second light-shielding material that covers the peripheral circuit region and is connected to a second potential that is different from the first potential;
a signal processing circuit configured to process an output signal from the solid-state imaging apparatus; and
an optical system configured to incident light on the solid-state imaging apparatus.

* * * * *